United States Patent [19]

Vedder

[11] 4,277,548
[45] Jul. 7, 1981

[54] METHOD OF PRODUCING A CHARGE PLATE FOR USE IN AN INK RECORDER

[75] Inventor: James L. Vedder, Sunland, Calif.

[73] Assignee: The Mead Corporation, Dayton, Ohio

[21] Appl. No.: 108,604

[22] Filed: Dec. 31, 1979

[51] Int. Cl.³ .................................................. G03F 7/22
[52] U.S. Cl. ..................................... 430/22; 428/901; 264/227; 264/220; 264/139; 264/DIG. 57; 156/668; 430/327
[58] Field of Search .................. 430/313, 311, 22, 319, 430/327, 939, 951, 314; 264/227, 220, 139, DIG. 57; 428/901; 156/668

[56] References Cited

U.S. PATENT DOCUMENTS 3,135,823  6/1964  Pritikin ................................. 430/314

Primary Examiner—John D. Welsh
Attorney, Agent, or Firm—Biebel, French & Nauman

[57] ABSTRACT

A process for the accurate generation and production of electrical lead lines and the like on a charge plate for use in an ink jet printing system is provided. In the process, a single master charge plate is utilized both as a model to produce molded charge plate blanks and also as a mask for generating charge plate artwork. Because the same master plate is utilized, any minor variations in the size, spacing, or alignment of orifices on the plate will be duplicated for both the blank, molded charge plate structure and the electrical artwork, permitting accurate alignment of the artwork to the orifices in the blank.

3 Claims, 9 Drawing Figures

METHOD OF PRODUCING A CHARGE PLATE FOR USE IN AN INK RECORDER

BACKGROUND OF THE INVENTION

This invention relates to the production of printed circuitry, and more particularly to a process for accurately aligning a series of printed circuit electrical leads to a series of electrodes on a charge plate for use in ink jet printing.

Coating heads of the type described in Beam et al, U.S. Pat. No. 3,586,907, are used in ink jet printing systems which create printed matter by selective charging, deflecting, and catching of drops produced by one or more row of continuously flowing ink jets. The jets themselves are produced by forcing ink under pressure through a series of orifices in an orifice plate, which is one component of the laminated coating head.

A stimulation arrangement stimulates the jets to break the ink up into uniformly sized and regularly spaced drops, with drop formation occurring in all jets at more or less fixed positions, all located approximately the same distance from the orifice plate. The charge plate is positioned within the coating head so that electrical charging of selected ones of the drops being generated is achieved.

A charge plate of the type used by the Beam et al patent utilizes a plate of dielectric material provided with a series of charging tunnels located equidistantly along a straight line. Each charging tunnel is coated with an electrically conductive material which defines a cylindrical charging electrode. Electrical leads must be connected to each such charge electrode, and the electrical leads in turn are selectively activated by an appropriate data processing system. Typical prior art charge plates including such electrodes are disclosed in Solyst, U.S. Pat. No. 3,975,741, in Kuhn, U.S. Pat. No. 3,984,843, and in Bassous et al, U.S. Pat. No. 4,047,184.

In addition to the difficulties arising in the fabrication of such charge plates, which is described in detail in the commonly assigned copending application of James L. Gudorf, Ser. No. 912,495, filed June 5, 1978 and entitled "Charge Plate and Method of Manufacture", now U.S. Pat. No. 4,195,304 difficulties have also arisen in accurately locating and aligning electrical lead lines with the individual charge tunnels. The difficulty of such an operation will be appreciated when it is remembered that the center-to-center spacing of each charge electrode is only about 0.423 mm and each charge electrode has an internal diameter of only about 0.355 mm, leaving a spacing between charge electrodes of only about 0.068 mm. Moreover, the width of an electrical lead is about 0.18 to 0.20 mm, leaving only about a 0.07 mm tolerance for misalignment with a charge electrode. Depending upon the size of the charge plate and the area to be printed, anywhere from several hundred to over one thousand connections per charge plate must be made.

Previous fabrication techniques involved the use of a multi-step photomechanical reproduction process. These techniques involved the use of one or more masks each containing a repetitive array of elements representative of the electrical leads to be formed ultimately on the charge plate. By a succession of alignment and fabrication steps such as deposition and/or etching, the finished device would be produced.

However, these techniques required both the accurate production of photomasks and the repeated accurate registration and alignment of them on the charge plate substrate. The problem of avoiding accumulation of error in such techniques is both difficult and expensive. Moreover, if the charge tunnel spacing and diameter on the charge plate is not exact, further alignment errors are introduced into the device. Since fabrication techniques are not perfect, slight size and spacing errors are almost unavoidable in forming charge tunnels. Thus, an accumulated alignment error of only a few thousandths of an inch (or hundredths of a millimeter) may result in either a missed connection or a short circuit.

Accordingly, the need exists in the art for a more reliable and accurate process for generating and aligning charge plate artwork (i.e. electrical leads and the like).

SUMMARY OF THE INVENTION

The present invention meets this need by utilizing a single master plate as a model to produce both the charge plate blank and the charge plate artwork. Because the same master plate is utilized, any minor variations in the size and/or spacing of orifices on the plate will be duplicated for both the charge plate blank and the artwork, allowing them to be correctly aligned.

In accordance with the practice of the present invention, a master charge plate is fabricated of stainless steel and serves as the model for producing both the molded charge plate blank and the charge plate artwork. The molded charge plate blank is formed by using a modification of the techniques taught in Gudorf, U.S. Pat. No. 4,195,304, and assigned to the assignee of the present invention. The steel master is placed in a mold, and a curable elastomeric compound is poured over it. Once cured, the elastomer is stripped away from the master resulting in a structure with a series of pegs corresponding to the positioning of the orifices in the steel master plate. The steel master plate is also provided with a plurality of alignment holes or indentations which may be located at each of the corners of the plate. These alignment holes or indentations produce corresponding pegs on the elastomer.

To form the charge plate blank the elastomer is placed in a mold with pegs facing up and a curable molding resin is poured over it. Once cured, the elastomer is peeled away to produce a dimensionally stable duplicate charge plate blank of the steel master plate having orifices sized and spaced exactly as they were on the master plate. The charge plate blank is then lapped to remove excess molding compound and plated in a conventional manner with copper or other suitable electrically conductive material.

In forming the photographic master used for producing the electrical leads, the steel master plate is again utilized. By using the steel master plate as a mask for the photographic master and exposing the photographic master with light through the charge tunnel and alignment holes, an exact pattern of holes will be formed on the photographic master. A pattern of electrical lead lines is then placed over the photographic master, and the master is exposed to light again to produce a finished pattern of electrical leads and holes. The photographic master is then processed in a conventional manner and used to print the artwork pattern on the photosensitized surface of a charge plate blank. The alignment holes on the photographic master and charge plate blank permits accurate alignment of the printed pattern over the charge tunnels. Because both the photographic master and charge plate blank are produced by using the same steel master plate, any minor variations in hole size or spacing in the steel master will be exactly compensated for, thus, permitting the accurate alignment of artwork. Once the artwork pattern has been printed onto the charge plate blank, it is etched and finished in a conventional manner to produce a completed charge plate.

Accordingly, it is an object of the present invention to provide a process for the accurate alignment of electrical lead artwork on a charge plate blank. This and other objects and advantages of the invention will become apparent from the following description, the accompanying drawings, and the appended claims.

DESCRIPTION OF THE PREFERRED EMBODIMENTS

Figure 1:
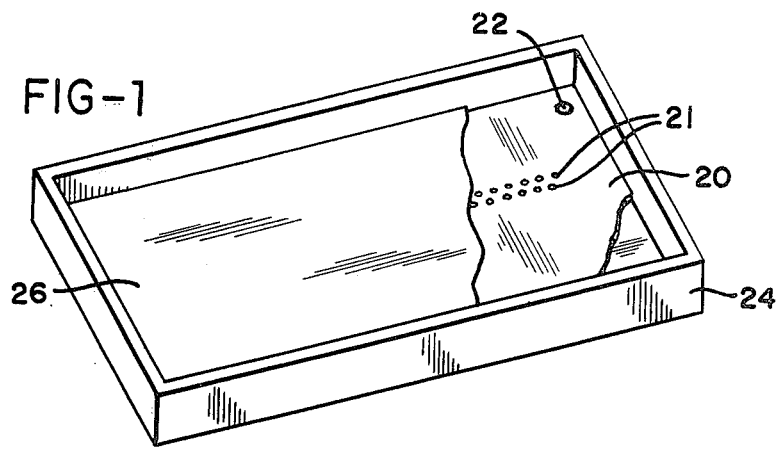
FIG. 1 is a partially cut away perspective view of a steel charge plate master in a casting mold with an elastomer cast in place.

The preferred method for producing charge plates in accordance with this invention is illustrated in detail in FIGS. 1 through 7. The procedure begins by producing a charge plate master 20, which has a series of tunnels 21. The tunnels 21 are fabricated in the master 20 by any convenient process so as to have the configuration and positioning required for the charging electrodes of the finished product. For example, master 20 may be fabricated of stainless steel, and tunnels 21 may be drilled to exacting specifications without regard for expense since only one master need be made. Alternatively, master 20 may be made in accordance with prior art processes for producing ceramic charge plates. In such an event, master 20 is chosen from among a series of plates produced as a production lot and is the most accurate of the plates so produced.

The tunnels of master 20 have a generally hour glass-shaped cross section, and this type of configuration is illustrated in the drawings. Two or more alignment holes 22 are positioned around the edge of master 20. In the embodiment illustrated, alignment holes 22 are positioned at each of the four corners of master 20, although different numbers of holes and positioning of them may be used.

Figure 2:
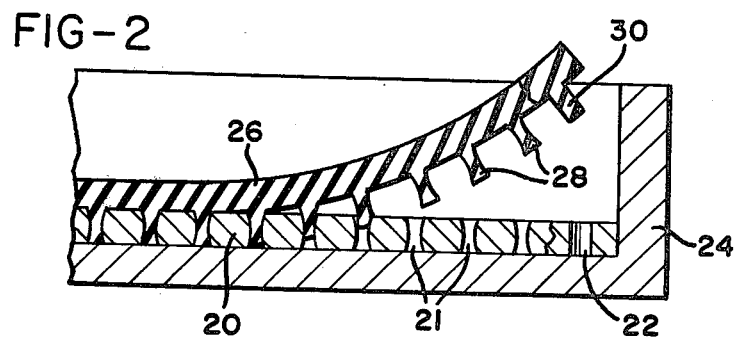
FIG. 2 is a cross-sectional view of the elastomer being peeled from the steelmaster.

Once the master has been fabricated, it is positioned within a fabrication fixture 24 as shown in FIGS. 1 and 2. Fixture 24 includes an arrangement for clamping the master plate 20 in place. The clamping arrangement is of conventional design and is not illustrated.

After the master plate has been clamped in place within fixture 24, a cured silicone elastomer mold 26 is prepared. Mold preparation is accomplished by pouring a suitable liquid silicone elastomeric material into fixture 24, completely covering master plate 20 and filling tunnels 21 and holes 22. Prior to pouring, the elastomer may be evacuated in a vacuum chamber for removal of all air bubbles. Fixture 24, with the liquid elastomer in place, may then be placed in a vacuum chamber for a second evacuation to insure the complete filling of all cavities within tunnels 21 and alignment holes 22 in master plate 20. After pouring and evacuation, the elastomer is pressed in place using a glass plate. Thereafter, the liquid elastomer is air cured to produce a mold 26 having a cross section as illustrated in FIG. 2.

Mold 26 includes a series of pegs 28 corresponding to the configuration of tunnels 21 as well as pegs 30 corresponding to the configuration of alignment holes 22. In order to achieve separation of mold 26 from master plate 20, it is desirable that mold 26 be quite elastic, an elongation capability of 100 percent being preferred. A suitable silicone elastomer for use in this invention is SILASTIC brand J RTV elastomer sold by Dow Corning Corp. of Midland, Mich. A mold produced from such material is easily peeled or flexed away from master plate 20 as illustrated in FIG. 2.

After mold 26 has been removed from master plate 20, it is sprayed with a suitable mold release agent such as Miller Stephanson MS-122 release agent sold by Miller Stephanson Chemical Company, Inc. of Danbury, Conn.

Figure 3:
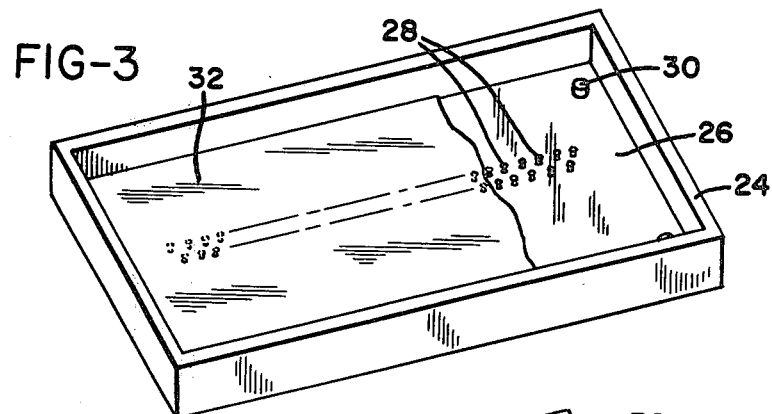
FIG. 3 is a partially cut away perspective view of the step of casting a charge plate blank using the elastomer mold.

Following the spraying of release agent, the mold 26 is returned to fixture 24 with pegs 28 and 30 standing upright as shown in FIG. 3. With the mold in this position, a suitable casting resin 32 is poured into fixture 24 to a thickness which just covers pegs 28 and 30. The casting resin should have a relatively low viscosity and exhibit little or no shrinkage upon curing. A suitable casting resin has been found to be an epoxy resin comprising Bisphenol A and epichlorhydrin available from Emerson and Cuming, Inc. of Northbrook, Ill., under the name STYCAST 2057. This resin may be mixed with a modified aliphatic amine catalyst, such as one available from Emerson and Cuming, Inc. under the designation Catalyst 9, prior to casting. The resin and catalyst mixture may be placed in a vacuum chamber to remove all air bubbles prior to casting. The resin is preferably cured at a temperature of about 38° C. in order to control the dimensions of the finished product.

The next step in the fabrication process is to remove mold 26 from fixture 24 and separate it from the intermediate charge plate structure 32. This separation is readily facilitated by the flexibility of mold 26 by the tendency of the silicone elastomer to have little adherence to the casting resin used to form the charge plate structure. Preferably, the mold is flexed for removal in like manner as for the earlier separation from the charge plate master. Coating with the mold release agent, as above described, also facilitates separation.

Figure 4:
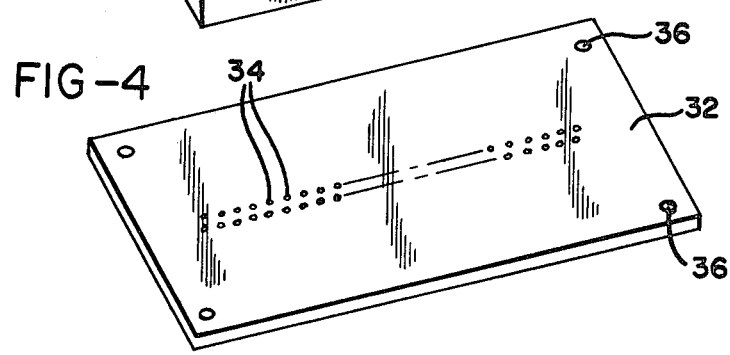
FIG. 4 is a perspective view of a cast charge plate blank.

After the separation is achieved, the intermediate charge plate structure is lapped or ground on both sides to produce a finished support structure as illustrated in FIG. 4 having charge tunnels 34 and alignment holes 36 extending therethrough. The structure is then plated with copper or other electrically conductive material in a manner conventional in the art. The structure 32 is an exact dimensional duplicate of master plate 20, including the placement of alignment of charge tunnels and alignment holes.

Figure 5A:
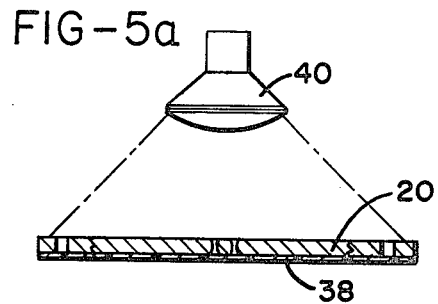
FIGS. 5a and 5b illustrate the steps of using a steel master plate as a mask to form a photographic master charge plate and overlaying and aligning that master with an electrical lead mask to produce a master photographic mask.

To form the electrical lead artwork, master plate 20 is utilized as a mask as illustrated in FIG. 5a. A photographic master 38 is exposed by light from source 40 through master plate 20. Once developed, the resulting photographic master exhibits an exact pattern of dots 42 corresponding to the charge tunnels 21 on the master plate 20. Thus, any slight misalignment of holes introduced into the blank charge plate structure 32 by imperfections in master plate 20 are exactly compensated for in the production of photographic master 38. Alignment holes 22 in master plate 20 are also exposed and result in a corresponding set of alignment spots 44 on photographic master 38. These spots are then utilized at a later stage of the process to align accurately the artwork with a blank charge plate structure.

Figure 5B:
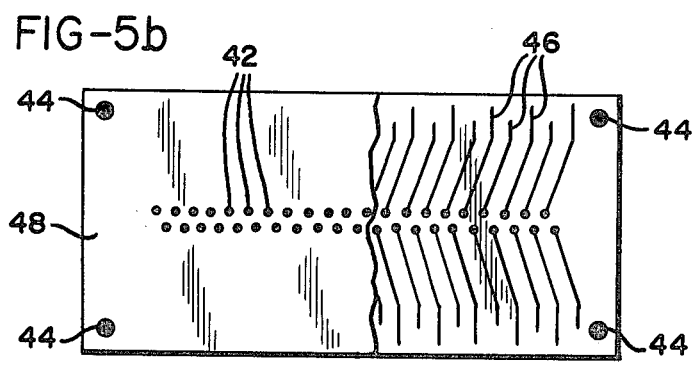

A pattern of lines 46 corresponding to electrical lead lines are then generated on a photographic plate by computer, as is conventional in the art, and the two patterns of dots 38 and lines 46 are superimposed as illustrated in FIG. 5b to form a single electrical artwork master plate 48. This master plate 48 is then used to form the electrical lead patterns on copper-plated charge plate structure 32.

Figure 6A:
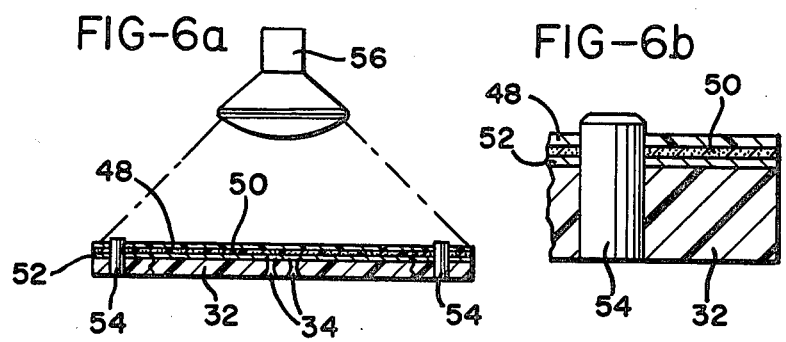
FIGS. 6a and 6b illustrate the step of forming a photoresist etching mask on a charge plate blank.
Figure 6B:
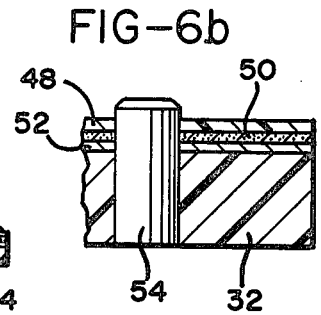
Figure 7:
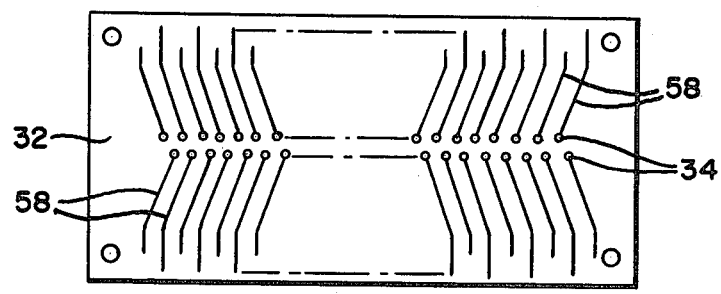
FIG. 7 shows the top view of a finished charge plate.

One method of forming the electrical lead patterns is illustrated in FIGS. 6 and 7. As shown in FIG. 6a, a layer of photoresist material 50 is provided on copper-plated layer 52 of charge plate structure 32. Master plate 48 is then laid over the layer of photoresist and acts as a mask. As shown in enlarged detail in FIG. 6b, a series of alignment pegs 54 may be utilized to insure proper alignment of master plate 48 on structure 32. Since the alignment holes in structure 32 correspond exactly to those in master plate 20, and master plate 20 was used as a mask to form plate 48, the alignment spots 44 on plate 48 can be drilled out accurately and the plate mounted on pegs 54. Upon exposure by a suitable source of light 56, suitable portions of the photoresist will be developed and harden. Using plate 48 as a positive working master and a positive photoresist material, the exposed areas of photoresist are developed and rinsed away leaving the unexposed pattern of holes and electrical lead lines adhering to the substrate. The copper on charge plate structure 32 is then etched away using a conventional copper etchant such as chromic acid or cupric chloride. Finally, the photoresist pattern is removed to produce the finished charge plate structure illustrated in FIG. 7 having electrical leads 58 extending from each charge electrode 34.

While the methods herein described constitute preferred embodiments of the invention, it is to be understood that the invention is not limited to these precise methods, and that changes may be made without departing from the scope of the invention.

What is claimed is:

1. Method of producing a charge plate for an ink jet printer comprising the steps of:
    (a) fabricating a master plate including a series of regularly spaced recesses,
    (b) casting an elastomeric molding material against said master plate and into said recesses, thereby producing an elastomer mold comprising a base and a series of pins projecting outwardly from said base,
    (c) separating said mold from said master,
    (d) casting a curable, nonconductive plastic material against said mold,
    (e) curing said plastic casting material to define a plastic charge plate structure having a series of regularly spaced charging tunnels,
    (f) separating said charge plate structure from said mold,
    (g) plating the surface of said charge plate structure with a layer of electrically conductive material,
    (h) generating a positive working photographic master of the electrical lead artwork pattern for said charge plate utilizing said master plate, and
    (i) forming an electrical lead extending from each of said charging tunnels by transferring said electrical lead artwork pattern to said charge plate structure and etching away said layer of electrically conductive material from the areas around said pattern.

2. The method of claim 1 wherein said master plate contains a plurality of alignment holes therethrough which are duplicated in said charge plate structure and said photographic master.

3. The method of claim 1 wherein said positive working photographic master is generated by exposing a photographic plate to radiation through said master plate to form an array of dots corresponding to said charging tunnels and superimposing an array of electrical lead artwork over said array of dots.

* * * * *